(12) United States Patent
Knigge et al.

(10) Patent No.: US 9,431,557 B2
(45) Date of Patent: Aug. 30, 2016

(54) PHOTODETECTOR FOR ULTRAVIOLET RADIATION, HAVING A HIGH SENSITIVITY AND A LOW DARK CURRENT

(75) Inventors: Andrea Knigge, Konigs Wusterhausen (DE); Markus Weyers, Wildau (DE); Hans-Joachim Wurfl, Zeuthen (DE)

(73) Assignee: Forschungsverbung Berlin E.V., Berlin (DE)

( * ) Notice: Subject to any disclaimer, the term of this patent is extended or adjusted under 35 U.S.C. 154(b) by 0 days.

(21) Appl. No.: 14/115,453

(22) PCT Filed: Apr. 26, 2012

(86) PCT No.: PCT/EP2012/057665
§ 371 (c)(1),
(2), (4) Date: Nov. 8, 2013

(87) PCT Pub. No.: WO2012/150177
PCT Pub. Date: Nov. 8, 2012

(65) Prior Publication Data
US 2014/0070272 A1    Mar. 13, 2014

(30) Foreign Application Priority Data
May 2, 2011 (DE) .................. 10 2011 075 103

(51) Int. Cl.
*H01L 31/00* (2006.01)
*H01L 31/0352* (2006.01)
(Continued)

(52) U.S. Cl.
CPC ... *H01L 31/035272* (2013.01); *H01L 31/0224* (2013.01); *H01L 31/022408* (2013.01);
(Continued)

(58) Field of Classification Search
CPC ............ H01L 31/035272; H01L 31/0224; H01L 31/1085; H01L 31/03529; H01L 31/022408; H01L 31/022466; H01L 31/109; H01L 31/035209; H01L 31/03048; H01L 31/1884; H01L 31/035281; H01L 31/102; Y02E 10/544; Y02P 70/521

USPC ............................................ 257/184; 438/48
See application file for complete search history.

(56) References Cited

U.S. PATENT DOCUMENTS

| 7,705,415 B1 | 4/2010 | Nabet |
| 2006/0081985 A1* | 4/2006 | Beach ............... H01L 29/0692 257/745 |

(Continued)

FOREIGN PATENT DOCUMENTS

| DE | 19615495 | 7/1999 |
| EP | 2023403 | 2/2009 |

(Continued)

OTHER PUBLICATIONS

Darling et al., "Epitaxial $n^+$ layer GaAs mesa-finger interdigital surface photodetectors", IEEE Electron Device Letters (1989) 10(10): 461-463.

(Continued)

*Primary Examiner* — John C Ingham
*Assistant Examiner* — Didarul Mazumder
(74) *Attorney, Agent, or Firm* — Fox Rothschild, LLP; Gregory A. Nelson; Robert J. Sacco

(57) ABSTRACT

The present invention relates to a UV photodetector having a high sensitivity and a low dark current. The object of the present invention is to specify a UV photodetector that has a high sensitivity and a low dark current. According to the invention, the fingers of the first electrode structure and the fingers of the second electrode structure have a cover layer made of a second semiconducting material, wherein the cover layer is arranged on the absorber layer and directly contacts the absorber layer in the region of the fingers, and the first semiconducting material and the second semiconducting material are designed in such a manner that a two-dimensional electron gas (2DEG) is formed at the boundary layer between the absorber layer and the cover layer in the region of the fingers.

8 Claims, 8 Drawing Sheets

Figure 1:
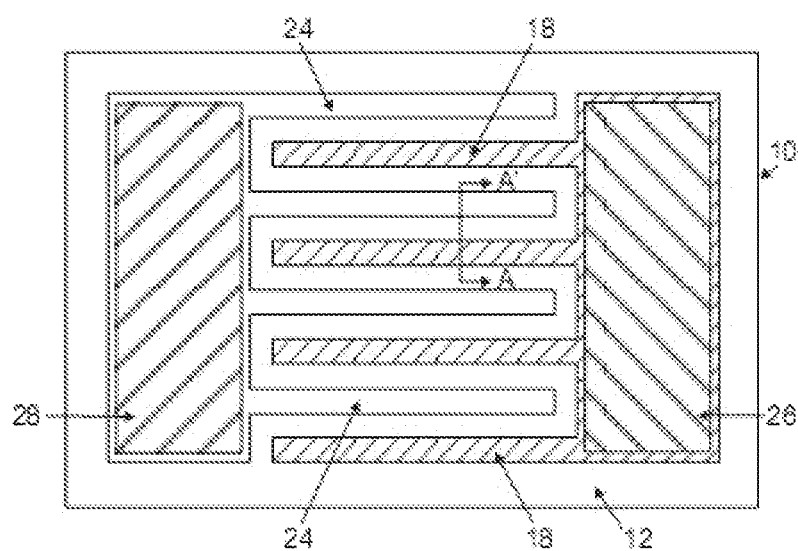

(51) Int. Cl.
*H01L 31/0224* (2006.01)
*H01L 31/0304* (2006.01)
*H01L 31/108* (2006.01)
*H01L 31/102* (2006.01)

(52) U.S. Cl.
CPC . *H01L31/022466* (2013.01); *H01L 31/03048* (2013.01); *H01L 31/035209* (2013.01); *H01L 31/035281* (2013.01); *H01L 31/102* (2013.01); *H01L 31/1085* (2013.01); *Y02E 10/544* (2013.01); *Y02P 70/521* (2015.11)

(56) References Cited

U.S. PATENT DOCUMENTS

| | | |
|---|---|---|
| 2006/0289761 A1 | 12/2006 | Nabet et al. |
| 2008/0185613 A1* | 8/2008 | Beach ............... H01L 29/2003 257/192 |
| 2009/0146178 A1* | 6/2009 | Miyachi .......... H01L 31/022408 257/184 |

FOREIGN PATENT DOCUMENTS

| | | | |
|---|---|---|---|
| GB | 2310756 | * | 2/1996 |
| GB | 2310756 | | 9/1997 |

OTHER PUBLICATIONS

Jiang et al., "Visible-blind metal-semiconductor-metal photodetectors based on undoped AlGaN/GaN high electron mobility transistor structure", Japanese Journal of Applied Physics (2004) 43(5B): L683-685.

Marso et al., "MSM diodes based on an AlGan/GaN HEMT layer structure for varactor and photodiode application", Advanced Semiconductor Devices and Microsystems (2002): 295-298.

Nabet, "A heterojunction metal-semiconductor-metal photodetector", IEEE Photonics Technology Letter (1997) 9(2): 223-225.

Werquin et al., "First results of AlGaN/GaN HEMTs on sapphire substrate using an argon-ion implant-isolation technology", Microwave and Optical Technology Letters (2005) 46(4): 311-315.

Gaska, R., et al., "Electron transport in AlGaN—GaN Heterostructures Grown on 6H—SiC Substrates," Applied Physics Letters, vol. 72, No. 6, Feb. 9, 1998, Copyright 1998 American Institute of Physics.

* cited by examiner a)

b)

PHOTODETECTOR FOR ULTRAVIOLET RADIATION, HAVING A HIGH SENSITIVITY AND A LOW DARK CURRENT

CROSS-REFERENCE TO RELATED APPLICATIONS

This application is a §371 national phase filing of PCT/EP2012/057665 filed Apr. 26, 2012, which claims priority to and the benefit of DE 10 2011 075 103.3 filed May 2, 2011 both of which are herein incorporated by reference in their entirety.

DESCRIPTION

The present invention relates to a photodetector, in particular a UV photodetector having a high sensitivity and a low dark current.

STATE OF THE ART

Ultraviolet radiation (hereinafter also UV radiation) can be detected on the basis of light absorption in a semiconductor. Semiconductor-based UV photodetectors can be designed as a photoconductor, as a Schottky photodiode or as a metal-semiconductor-metal detector (hereinafter also MSM detector).

A typical photodetector consists of a layer of a suitable semiconductor material that has been grown on a substrate. Furthermore, contacts are provided, which can be connected to a read-out circuit. As the absorbed photons can, as a rule, only be detected near the contacts or in the region between the contacts, photodetectors are illuminated from above in many cases. However, it is an inherent drawback of such a detector that the region below the metal contacts that are conventionally used is shadowed.

A photoconductor consists of a suitable semiconductor layer, for example aluminium gallium nitride, and two ohmic contacts to which a voltage is applied. Said voltage causes an electric field, and a current may flow between the contacts, depending on the conductivity of the semiconductor layer. If the conductivity of the semiconductor layer is increased by illumination due to photogenerated charge carriers, an additional photocurrent can be measured. In a photoconductor, the entire region between the contacts contributes to the total current. The distances to the contacts are relatively large, so that the response times are relatively long on the one hand and gain mechanisms may occur on the other, the latter being caused by running time differences of the two types of charge carriers. Said gain mechanisms allow quantum efficiency values of more than 100%. For this reason, photoconductors have a very high sensitivity, compared to other types of detectors, but no linear behaviour of their sensitivity. In addition, said gain mechanism also affects thermally generated charge carriers, which means that photoconductors have a disadvantageous high dark current. As a further disadvantage, the dark current is not reduced by potential barriers, e.g. at the metal/semiconductor boundary layer.

A Schottky photodiode consists of a semiconductor layer including a large-area Schottky contact and an ohmic contact. Here, the space charge region is directly underneath the Schottky contact, which means that said contact must be semi-transparent. The semi-transparent metal contact causes a disadvantageous weakening of the signal to be measured due to absorption. Furthermore, the contact may become more and more ohmic in character due to energy input, resulting in a degradation of the component (increase of the leakage current). Due to the requirement of a trenched doped layer as a rear electrode, these detectors have to undergo a complex process including the steps of exposing and contacting this layer, whose limited conductivity, in addition, places a limit on the dimensions of the components. As regards the parameters of bandwidth, linearity and dark current or contrast, Schottky photodiodes show a similar behaviour as MSM detectors.

MSM detectors consist of a semiconductor layer including two interlocked Schottky contacts. A voltage is applied to the contacts, so that one of the Schottky contacts is at a blocking voltage and the other Schottky contact is at a forward voltage. Here, the photons are detected according to the same principle as in a p-n junction, based on the separation of the electron-hole pairs in the space charge region and the resulting photocurrent. The width of the space charge region increases as the blocking voltage increases, which means that the characteristics, such as bandwidth and sensitivity, can be varied by varying the applied voltage. To maximize the active detector surface in order to achieve the highest possible sensitivity, the metal contacts are arranged in a finger structure. The spacing of the fingers and the applied voltage must be selected such that, as far as possible, the entire region between the contacts acts as a detector surface, i.e. all electron-hole pairs are generated within the diffusion length of the space charge region so that they contribute to the photocurrent.

Further photodetectors are known from Nabet, B. "A Heterojunction Metal-Semiconductor-Metal Photodetector", IEEE Photonics Technology Letters, 1997, Vol. 9, No. 2. pp. 223-225, U.S. Pat. No. 7,705,415 B1 and EP 2 023 403 A1.

Conventional MSM photodetectors have the disadvantage that their photosensitivity is reduced by the shadowing metal fingers. Furthermore, it cannot be ruled out that the metal contacts on the semiconductor (for example GaN as an absorber) will degrade as they become more and more ohmic. In addition, an exposed semiconductor surface (for example GaN) subjected to UV radiation may lead to increased leakage currents along the surface and, as a result, to increased dark currents.

Furthermore, it is known from Jiang et al. "Visible-Blind Metal-Semiconductor-Metal Photodetectors Based on Undoped AlGaN/GaN High Electron Mobility Heterostructure", Jpn. J. Appl. Phys. 43, L683-L685 (2004) to provide an additional AlGaN layer between the semiconductor absorber layer and the metal contacts, which AlGaN layer forms a stable barrier towards the semiconductor (absorber). The metal contact is then formed on this AlGaN layer. However, the sensitivity of such an MSM detector is still very limited due to the shadow effects caused by the metal fingers.

DISCLOSURE OF THE INVENTION

The object of the invention is therefore to specify a UV photodetector that overcomes the drawbacks of the state of the art. In particular, the UV photodetector according to the invention should have a high sensitivity and a low dark current. Furthermore, the UV photodetector according to the invention should be cost-efficient to manufacture. Moreover, the UV photodetector according to the invention should have a large bandwidth or a high detectivity, so that it can be used, for example, in optical communications.

According to the invention, these objects are achieved by means of the features set out in patent claim 1 and patent claim 5. Useful configurations of the invention are contained in the sub-claims.

The idea of the present invention is to modify an MSM photodetector in such a manner that on the absorber layer, which preferably consists of GaN (gallium nitride) or AlGaN (aluminium gallium nitride), a barrier layer (hereinafter also referred to as cover layer) is formed, whereby a conductive channel is obtained between the cover layer and the absorber layer due to a two-dimensional electron gas (2DEG). For this purpose, the cover layer must have a higher aluminium content than the underlying absorber layer. If the layers have the metal-polar c axis orientation, which is normally used, electrons will accumulate at the boundary layer between the absorber and the cover layer due to the overlap between spontaneous and piezoelectric polarization, which electrons form the conductive channel. According to the invention, the conductive layer stack of the absorber layer and the cover layer has a finger-like structure, wherein the conductivity between the fingers must be reduced to ensure low dark currents. As the conductive channel will be formed in the boundary region between the absorber layer and the cover layer, a finger-like structure of the layer stack does not necessarily mean that both layers (absorber layer and cover layer) must have a finger-like structure. It is sufficient if the cover layer has a finger-like structure. Alternatively, both layers (absorber layer and cover layer) may have a finger-like structure, wherein the absorber layer preferably has a finger structure only near its surface in this case.

In general, it is preferred if the absorber layer is arranged between the cover layer and the substrate, i.e. the cover layer is arranged on top of the absorber layer. However, the cover layer may also be arranged between the absorber layer and the substrate, whereby the cover layer is arranged below the absorber layer in such an embodiment variant. The feature "cover layer arranged on the absorber layer" can therefore mean that the cover layer covers the absorber layer from above or from below.

The two-dimensional electron gas can preferably be structured by removing the cover layer (etching) or by suitable flat ion implantation, whereby the conductivity of the 2DEG is destroyed or sufficiently reduced in the region between the fingers.

In the preferred variant of the invention, the 2DEG is used as a supply path and there is absolutely no metal contact in the region of the fingers (area of detection). As a result, all shadow effects are eliminated.

The principle of the invention, i.e. supply by way of a 2DEG, may also be transferred to photodetectors whose absorber layer is made of InGaN instead of GaN for longer wavelengths and to photodetectors whose absorber layer is made of AlGaN instead of GaN for shorter wavelength. In the latter case, the cover layer preferably consists of AlGaN as well but must have a higher Al content than the absorber layer.

All structural variants according to the invention preferably comprise a UV transparent protective layer (preferably $AlO_x$) for stabilizing the surface by avoiding any contact with oxidizing media (air) and for improved coupling-in of light at a working wavelength. The optical thickness of the protective layer must be adapted to the desired working wavelength.

According to a first aspect of the invention, the detector according to the invention comprises a carrier substrate; an absorber layer made of a first semiconducting material; a first (preferably comb-shaped) electrode structure including a plurality of fingers, a second (preferably comb-shaped) electrode structure including a plurality of fingers, wherein the fingers of the first electrode structure and the fingers of the second electrode structure interlock without touching each other, and a first contact and a second contact, wherein the first contact is spaced from the second contact, wherein the fingers of the first electrode structure and the fingers of the second electrode structure each have a cover layer made of a second semiconducting material and the cover layer is arranged on the absorber layer and directly contacts the absorber layer in the region of the fingers, and wherein the first semiconducting material and the second semiconducting material are designed in such a manner that a two-dimensional electron gas is formed at the boundary layer between the absorber layer and the cover layer in the region of the fingers.

This means the idea is to form the fingers of two semiconducting layers (absorber layer and cover layer), wherein the semiconducting materials are selected such that a conductive channel (2DEG) is obtained. For the purpose of the present invention, a 2DEG has an electron mobility higher than 100 $cm^2$/Vs, preferably higher than 500 $cm^2$/Vs, more preferably higher than 1000 $cm^2$/Vs and even more preferably higher than 1200 $cm^2$/Vs. Furthermore, a 2DEG has a layer concentration of free electrons higher than $10^{10}$ $cm^{-2}$, preferably higher than $10^{11}$ $cm^{-2}$, more preferably higher than $10^{12}$ $cm^{-2}$ and even more preferably higher than $10^{13}$ $cm^{-2}$. According to the invention, the regions between the fingers are designed in such a manner that there is no 2DEG there. This can be achieved if the electron mobility is lower than 100 $cm^2$/Vs, preferably lower than 50 $cm^2$/Vs, more preferably lower than 30 $cm^2$/Vs and even more preferably lower than 10 $cm^2$/Vs. Alternatively, the 2DEG may also be removed by removing the cover layer and the associated polarization charges. For this purpose, the layer concentration of free electrons must be reduced to below $10^{11}$ $cm^{-2}$, preferably below $10^{10}$ $cm^{-2}$.

Preferably, the cover layer is removed from the absorber layer in the region between the fingers. In a preferred variant, this can be done by etching the cover layer in the region between the fingers, whereby the 2DEG is removed. Alternatively, it is preferred if the cover layer covers the absorber layer in the region between the fingers as well as in the region of the fingers, wherein the cover layer is treated by (flat) ion implantation in such a manner that the mobility is sufficiently reduced at the boundary layer between the cover layer and the absorber layer, thus destroying the conductive channel there.

Preferably, the absorber layer is formed of gallium nitride, indium gallium nitride or aluminium gallium nitride. Preferably, the cover layer is formed of aluminium gallium nitride. The aluminium content of the cover layer must be higher than the aluminium content of the absorber. Preferably, a protective layer is provided, which completely covers the first electrode structure and the second electrode structure. Alternatively, it is preferred if the protective layer is only applied between the fingers (if these comprise a metal).

Preferably, the protective layer is formed of aluminium oxide, silicon dioxide or silicon nitride or combinations of these materials. Preferably, the first contact and/or the second contact comprise(s) a metal. More preferably, the first contact and/or the second contact consist(s) of different metal layers or a metal alloy.

Preferably, the first contact and/or the second contact is/are designed as (an) ohmic contact(s), i.e. the work function of the metal of the contact is lower than the work function of the semiconductor that directly contacts the contact.

Preferably, the fingers have a length between 30 and 1000 μm, more preferably between 50 and 150 μm. Preferably, the fingers have a width between 2 and 30 μm, more preferably between 10 and 20 μm. Preferably, the distance between the fingers is between 2 and 15 μm, more preferably between 5 and 8 μm. Preferably, the thickness of the absorber layer is between 0.1 and 10 μm, more preferably between 1.0 and 5 μm. Preferably, the thickness of the cover layer is between 2 and 100 nm, more preferably between 10 and 30 nm. According to a preferred embodiment variant of the invention, the number of fingers per electrode structure is between 2 and 50, more preferably between 3 and 10.

Preferably, the fingers of the first and second electrode structures do not comprise metal, which means that shadow effects can be avoided in a particularly efficient manner.

Preferably, the absorber layer extends across the entire area of the first and second electrode structures as well as of the first and second contacts. Preferably, the absorber layer, the cover layer (and the protective layer if any) are designed as planar layers having a uniform layer thickness. Preferably, the absorber layer and/or the cover layer is/are formed of undoped semiconducting materials.

The UV detectors according to the invention are preferably manufactured by forming an epitaxial structure: substrate, buffer layer (if appropriate), absorber layer (preferably GaN) and cover layer (preferably AlGaN). The formation of the epitaxial structure and the structuring steps may be combined with the simultaneous formation of further electronic components (optional integration of electronics and optical detection, optical switches). Structuring of the cover layer in order to form the fingers or the (comb-shaped) finger structure is done by etching or by implantation (preferably using a mask). In both cases, the conductivity and, as a result, the 2DEG between the fingers is destroyed, thus forming the (conductive) finger structure in the regions that have not been treated.

The fingers including metal are only contacted in the outer region of the fingers (facing the relevant contact), for example in the area of the rail (if any).

Subsequently, an insulator (protective layer) is optionally deposited on the whole surface. Said insulator provides protection from the environment. Furthermore, the insulator may be designed as an anti-reflection layer, which means that the sensitivity is increased due to improved coupling-in of the light to be detected. The insulator may be applied prior to implantation in order to avoid the surface from being contaminated after the implantation step.

Compared to conventional MSM detectors, the 2DEG photodetector according to the invention has the advantage that the incident light is not reduced due to shadow cast by the metal fingers, which means that a large active surface, i.e. high quantum efficiency, can be achieved. Furthermore, the 2DEG has a high electron mobility, i.e. the 2DEG photodetector according to the invention has a large bandwidth. As surface states are ruled out in case of implanted photodetectors, a low dark current can be achieved.

In an alternative embodiment variant of the invention, an MSM detector that does include metal fingers is modified in such a manner that a cover layer made of a semiconducting material is arranged between the absorber layer and the metal fingers (in the region of the fingers), wherein the band gap of the semiconducting material of the cover layer is larger than the band gap of the semiconducting material of the absorber layer, so that a dark current can be reduced in an efficient manner. For this purpose, according to a second aspect of the invention, the detector of the invention comprises a carrier substrate; an absorber layer made of a first semiconducting material; a first (preferably comb-shaped) electrode structure including a plurality of fingers, a second (preferably comb-shaped) electrode structure including a plurality of fingers, wherein the fingers of the first electrode structure and the fingers of the second electrode structure interlock without touching each other, a first contact and a second contact, wherein the first contact is spaced from the second contact, and wherein the contacts and the fingers comprise a metal or are formed of a metal or a metal alloy, wherein a cover layer made of a second semiconducting material is arranged between the fingers and the absorber layer, wherein the cover layer directly contacts the absorber layer in the region of the fingers, and the first semiconducting material has a smaller band gap than the second semiconducting material, wherein the cover layer exposes the absorber layer in the region between the fingers, or alternatively (in case of implantation), the cover layer covers the absorber layer in the region between the fingers as well as in the region of the fingers, wherein the cover layer is formed in such a manner (by flat ion implantation) that the conductivity is destroyed or sufficiently reduced, i.e. is lower than 100 $cm^2$/Vs, in the cover layer and in the region between the cover layer and the absorber layer.

Preferably, the first contact (and the associated electrode structure) and/or the second contact (and the associated electrode structure) is/are arranged directly on the cover layer and designed as (a) Schottky contact(s). In an alternative embodiment variant, one of the contacts (and the associated electrode structure) is designed as a Schottky contact and the other contact (and the associated electrode structure) is designed as an ohmic contact.

Preferably, the absorber layer extends across the entire area of the first and second electrode structures as well as of the first and second contacts. Preferably, the absorber layer and/or the cover layer is/are formed of undoped semiconducting materials.

Preferably, the absorber layer is formed of gallium nitride, indium gallium nitride or aluminium gallium nitride. Preferably, the cover layer is formed of aluminium gallium nitride. Preferably, a protective layer is provided, which completely covers the first electrode structure and the second electrode structure. Preferably, the protective layer is formed of aluminium oxide, silicon dioxide or silicon nitride or combinations of these materials. Preferably, the first contact and/or the second contact comprise(s) a metal. More preferably, the first contact and/or the second contact consist(s) of a metal or a metal alloy.

Preferably, the fingers have a length between 30 and 1000 μm, more preferably between 50 and 150 μm. Preferably, the fingers have a width between 2 and 30 μm, more preferably between 10 and 20 μm. Preferably, the distance between the fingers is between 2 and 15 μm, more preferably between 5 and 8 μm. Preferably, the thickness of the absorber layer is between 0.1 and 10 μm, more preferably between 1.0 and 5 μm. Preferably, the thickness of the cover layer is between 2 and 100 nm, more preferably between 10 and 30 nm. According to a preferred embodiment variant, the number of fingers per electrode structure is between 2 and 50, more preferably between 3 and 10.

Preferably, the absorber layer extends across the entire area of the first and second electrode structures as well as of the first and second contacts. Preferably, the absorber layer, the cover layer (and the protective layer if any) are designed as planar layers having a uniform layer thickness. Preferably, the absorber layer and/or the cover layer is/are formed of undoped semiconducting materials.

SHORT DESCRIPTION OF THE DRAWINGS

The invention will now be described in more detail with reference to exemplary embodiments.

Figure 2:
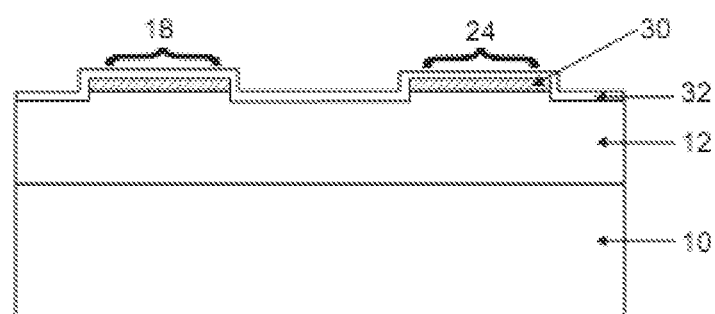
Figure 2:
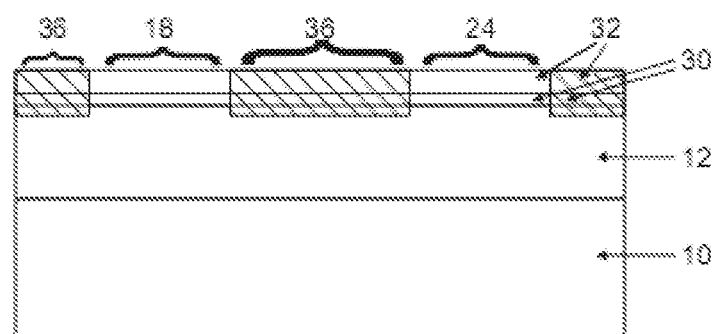
Figure 3:
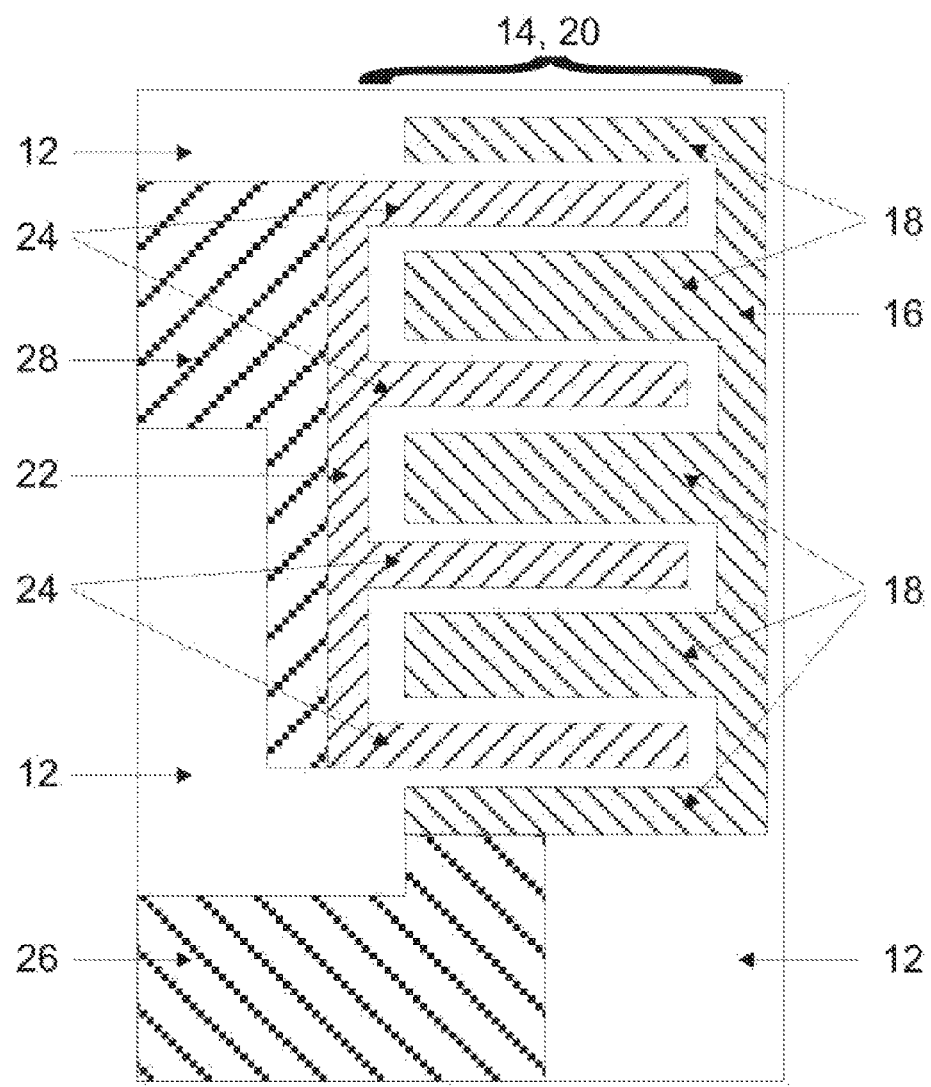
Figure 4:
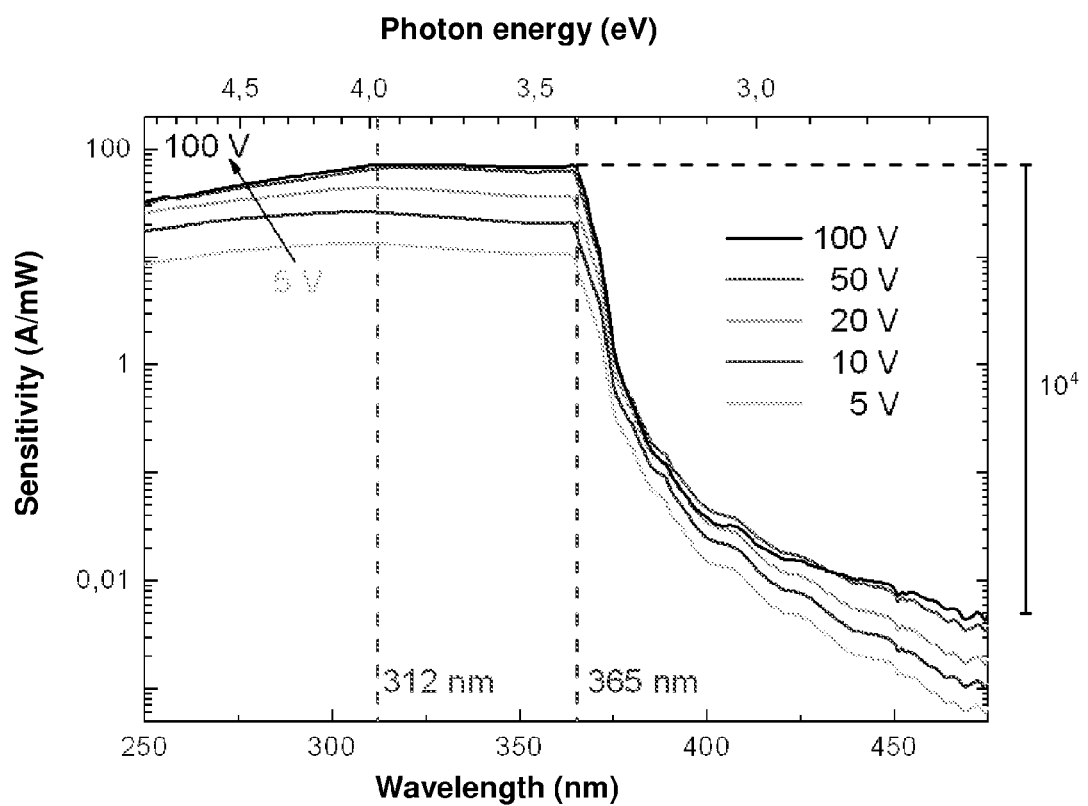
Figure 5:
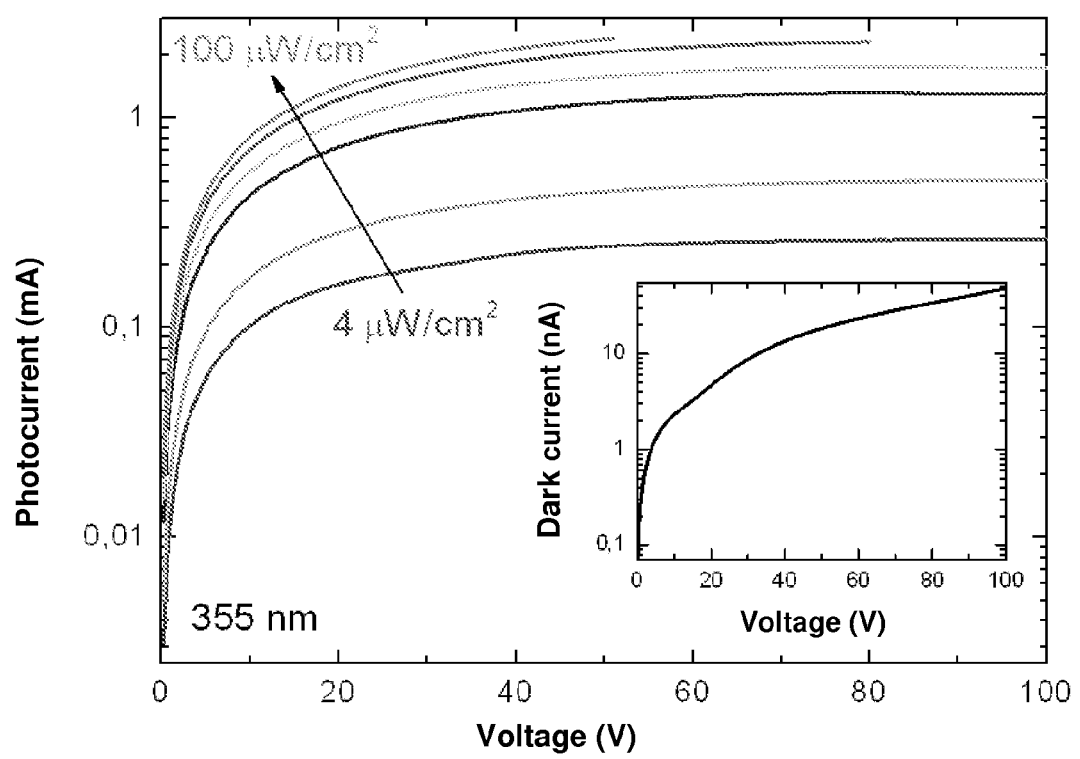
Figure 6:
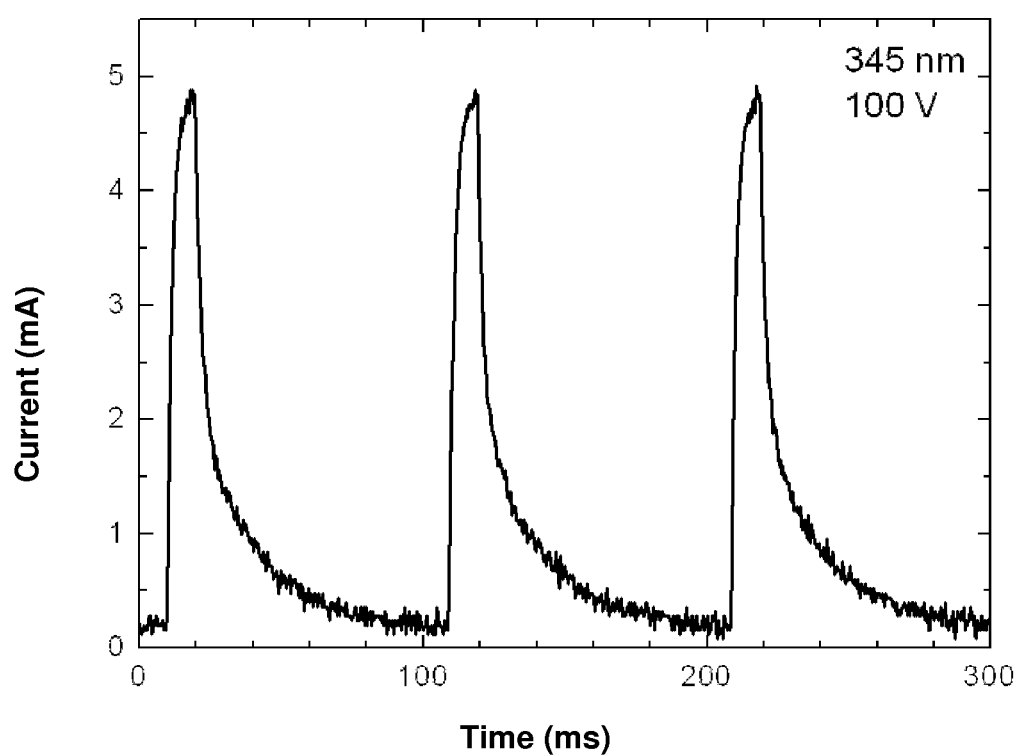
Figure 7:
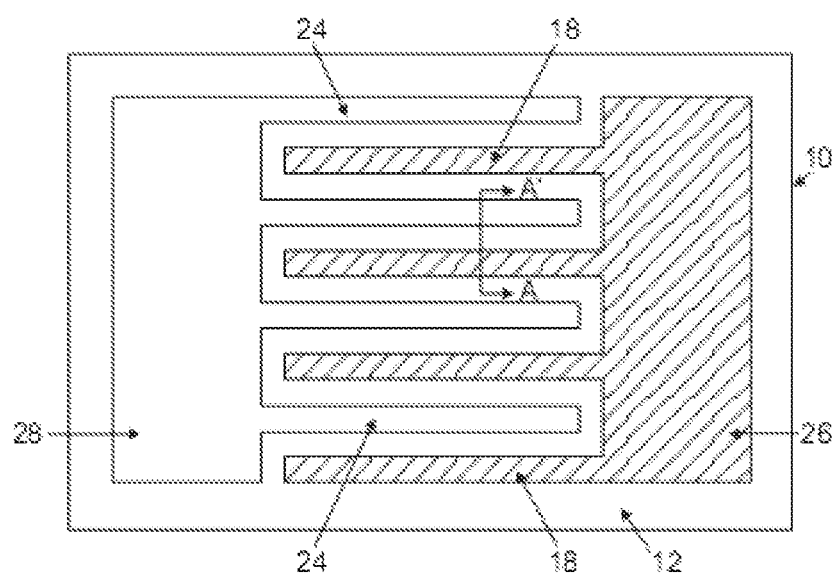
Figure 8:
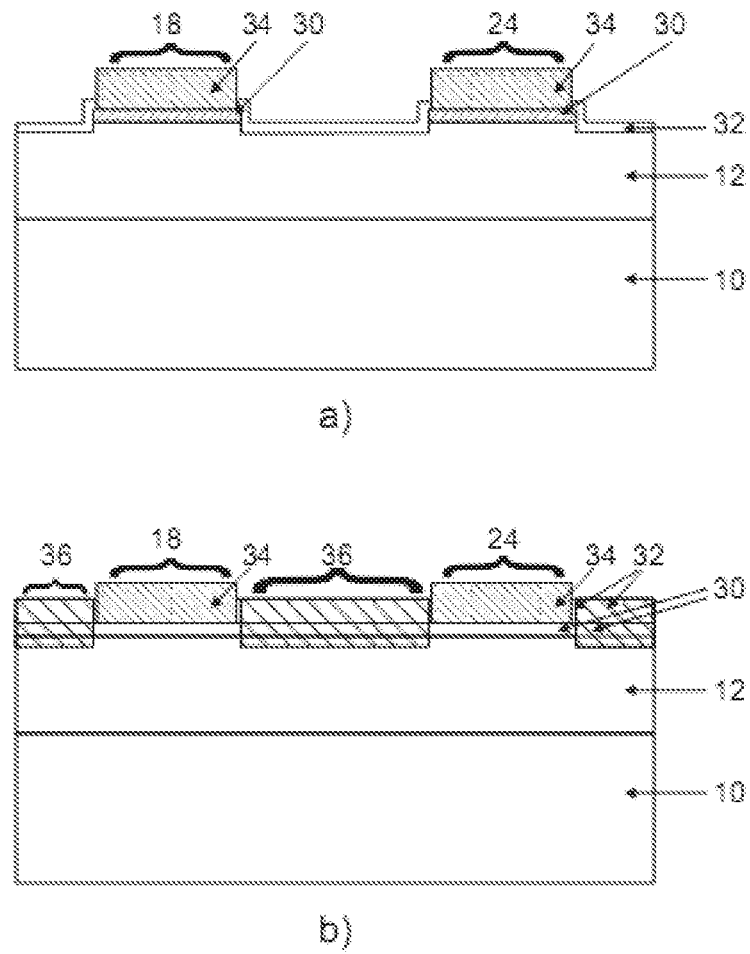

In the figures:

FIG. 1 shows a plan view of a UV photodetector according to the invention,

FIG. 2a shows the UV photodetector of FIG. 1 including a cover layer structured by etching in a schematic section along the cutting line A-A', FIG. 2b shows the UV photodetector of FIG. 1 including a cover layer structured by implantation in a schematic section along the cutting line A-A', FIG. 3 shows a plan view of another design of a UV photodetector according to the invention, FIG. 4 shows the sensitivity of the detector shown in FIG. 3 as a function of the wavelength, FIG. 5 shows the photocurrent of an exemplary embodiment of the detector shown in FIG. 3 as a function of the applied voltage, FIG. 6 shows the temporal resolution of the photocurrent of the exemplary embodiment of the detector shown in FIG. 3 in case of optical switching at 10 Hz at a wavelength of 345 nm, FIG. 7 shows a plan view of a UV photodetector of the invention according to an alternative embodiment variant, FIG. 8a shows the UV photodetector of FIG. 7 including a cover layer structured by etching in a schematic section along the cutting line A-A', and FIG. 8b shows the UV photodetector of FIG. 7 including a cover layer structured by implantation in a schematic section along the cutting line A-A'.

DETAILED DESCRIPTION OF THE DRAWINGS

FIGS. 1, 2a and 2b show an exemplary embodiment of a UV photodetector according to the invention. A nucleation layer (not shown here) having a thickness of 50 nm is applied to the substrate 10. An undoped, 1.6 µm thick GaN absorber layer 12 is applied to this nucleation layer. Then, a 20 nm thick cover layer 30 made of undoped AlGaN having an aluminium content of 25% is applied to the absorber layer 12. In the present exemplary embodiment, all layers are grown by means of metal-organic vapour phase epitaxy. The contacts 26, 28 are, for example, formed of titanium, aluminium or a titanium-aluminium alloy. The contacts 26, 28 containing metal only contact the fingers 18, 24 in the outer region of the fingers 18, 24, e.g. in the area of the rails 16, 22 (see FIG. 3). The fingers 18, 24 have a length of 70 µm and a width between 10 and 20 µm. The distance of adjacent fingers is between 5 and 8 µm.

The additional cover layer 30 having a finger-like structure causes a 2DEG to be generated in the boundary layer between the absorber layer 12 and the cover layer 30, which constitutes a conductive channel, so that according to the invention, metal need not be used in the fingers 18, 24. As a result, shadow effects are reduced and the sensitivity of the detector is increased. At the same time, the finger-like structure of the cover layer 30 reduces the dark current. The structure in the cover layer 30 can be achieved by etching in the regions between the fingers (FIG. 2a) or by implantation in the regions between the fingers (FIG. 2b). In other words, the 2DEG is only present in the fingers but not between the fingers. Furthermore, a protective layer 32 is provided, which covers the layers 12 and 30 in the entire photosensitive region.

FIG. 3 shows an alternative configuration of the UV photodetector according to the invention. While the metal contacts 26, 28 cover the rails almost completely in the embodiment variant of FIG. 1, the rails 16, 22 are not covered by the metal contacts 26, 28 in the embodiment variant of FIG. 3. Furthermore, it is not an essential requirement that the metal contacts 26, 28 are arranged symmetrically to the electrode structures 14, 20. The layer thicknesses and materials are the same as in FIG. 1. The fingers 18, 24 have a length of 70 µm. The fingers 18 of the first electrode structure have a width of 20 µm and the fingers 24 of the second electrode structure have a width of 10 µm. The distance of adjacent fingers is 5 µm and the distance between the finger ends and the rail of the other electrode structure is 8 µm in each case. The photosensitive region has a surface area of 160 µm×100 µm. The 2DEG formed at the boundary layer between the absorber layer 12 and the cover layer 30 has a charge carrier density of $8*10^{12}$ cm$^{-2}$ and an electron mobility of 1800 cm$^2$/Vs.

FIG. 4 shows the sensitivity of the detector shown in FIG. 3 as a function of the wavelength at an optical input power of 100 µW/cm$^2$. It can be seen that the UV photodetector has a maximum sensitivity at 312 nm (the maximum sensitivity is 70 A/mW for a voltage of 100 V) and a limiting wavelength of 365 nm from which the sensitivity drops sharply. The contrast of the sensitivity to UV radiation to the sensitivity to visible VIS radiation is $10^4$.

FIG. 5 shows the photocurrent of the detector shown in FIG. 3 as a function of the applied voltage for different optical input powers between 4 µW/cm$^2$ and 100 µW/cm$^2$ at a wavelength of 355 nm. As there is a saturation of the photocurrent at 80 V, optical switching of the detector to a defined photocurrent can be adjusted by means of the optical input power at higher voltages. As the dark current is below 50 nA in the shown measuring range, a UV signal having a contrast of 5 orders of magnitude can be detected.

FIG. 6 shows the temporal resolution of the photocurrent of the detector shown in FIG. 3 in case of optical switching at 10 Hz at a wavelength of 345 nm. The response time of the photodetector is approx. 6 ms.

FIGS. 7, 8a and 8b show a UV photodetector of the invention according to an alternative embodiment variant. While in the UV photodetectors of FIGS. 1 to 3, there are absolutely no metal contacts in the region of the fingers 18, 24 in order to reduce shadow effects, an MSM detector that does include metal fingers is modified in such a manner that a cover layer 30 made of a semiconducting material is arranged between the absorber layer 12 and the metal fingers 34 (i.e. the metal is not only located in the region of the contacts 26, 28 but also in the region of the fingers 18, 24), which cover layer 30 has a finger-like structure. The structure of the cover layer 30 can be achieved by etching in the regions between the fingers (FIG. 8a) or by implantation in the regions between the fingers (FIG. 8b). In other words, the cover layer 30 is only present in the fingers but not between the fingers. This means the fingers consist of the layers 12, 30 and 34 in this case. Furthermore, a protective layer 32 is provided, which covers the layers 12 and 30 in the entire photosensitive region. However, the metal layer 34 of the fingers 18, 24 need not necessarily be covered by the protective layer 32.

The finger-like structure of the cover layer 30 causes the conductivity in the cover layer 30 and in the region between the cover layer 30 and the absorber layer 12 (between the fingers 18, 24) to be destroyed or sufficiently reduced, so that advantageously, the dark current of the UV photodetector can be reduced, compared to a conventional MSM detector (without a cover layer between the absorber layer and the metal fingers).

LIST OF REFERENCE NUMERALS

10 Carrier substrate
12 Absorber layer
14 (Comb-shaped) first electrode structure
16 Rail of the first electrode structure
18 Finger(s) of the first electrode structure
20 (Comb-shaped) second electrode structure
22 Rail of the second electrode structure
24 Finger(s) of the second electrode structure
26 First contact
28 Second contact
30 Cover layer
32 Protective layer
34 Metal layer
36 Implantation region
A-A' Cutting line

What is claimed is:

1. A photodetector comprising:
   a carrier substrate;
   an absorber layer made of a first semiconducting material;
   a first electrode structure including a plurality of fingers,
   a second electrode structure including a plurality of fingers, wherein the fingers of the first electrode structure and the fingers of the second electrode structure interlock without touching each other,
   a first contact and a second contact, wherein the first contact is spaced from the second contact,
   wherein the fingers of the first electrode structure and the fingers of the second electrode structure comprise a cover layer made of a second semiconducting material, wherein the cover layer is arranged on the absorber layer and directly contacts the absorber layer in the region of the fingers, wherein the cover layer is completely absent in the region between the fingers, and wherein the first semiconducting material and the second semiconducting material are designed in such a manner that a two-dimensional electron gas is formed at the boundary layer between the absorber layer and the cover layer in the region of the fingers.

2. The photodetector according to claim 1, wherein the fingers of the first and second electrode structures do not comprise metal.

3. The photodetector according to claim 1, wherein the first contact and/or the second contact is/are formed of a metal, different metal layers or of a metal alloy.

4. The photodetector according to claim 1, wherein the cover layer is arranged on top of the absorber layer or below the absorber layer.

5. A photodetector comprising:
   a carrier substrate;
   an absorber layer made of a first semiconducting material;
   a first electrode structure including a plurality of fingers,
   a second electrode structure including a plurality of fingers, wherein the fingers of the first electrode structure and the fingers of the second electrode structure interlock without touching each other,
   a first contact and a second contact, wherein the first contact is spaced from the second contact,
   wherein the fingers of the first electrode structure and the fingers of the second electrode structure comprise a cover layer made of a second semiconducting material, wherein the cover layer is arranged on the absorber layer and directly contacts the absorber layer in the region of the fingers, and the first semiconducting material and the second semiconducting material are designed in such a manner that a two-dimensional electron gas is formed at the boundary layer between the absorber layer and the cover layer in the region of the fingers, wherein the cover layer is configured for covering the absorber layer in the region between the fingers and as well as in the region of the fingers, and wherein the electron mobility in the region between the fingers is less than 100 $cm^2/Vs$.

6. The photodetector according to claim 5, wherein the fingers of the first and second electrode structures do not comprise metal.

7. The photodetector according to claim 5, wherein the first contact and/or the second contact is/are formed of a metal, different metal layers or of a metal alloy.

8. The photodetector according to claim 5, wherein the cover layer is arranged on top of the absorber layer or below the absorber layer.

* * * * *